Oct. 21, 1958 O. KUMMER 2,857,479

DISTORTION REDUCING TUNED AMPLIFIER

Filed March 20, 1953

INVENTOR
O. KUMMER
BY *Franklin Mohr*
ATTORNEY

United States Patent Office 2,857,479

Patented Oct. 21, 1958

2,857,479

DISTORTION REDUCING TUNED AMPLIFIER

Oscar Kummer, Basking Ridge, N. J., assignor to Bell Telephone Laboratories, Incorporated, New York, N. Y., a corporation of New York Application March 20, 1953, Serial No. 343,741

5 Claims. (Cl. 179—171)

Figure 1:
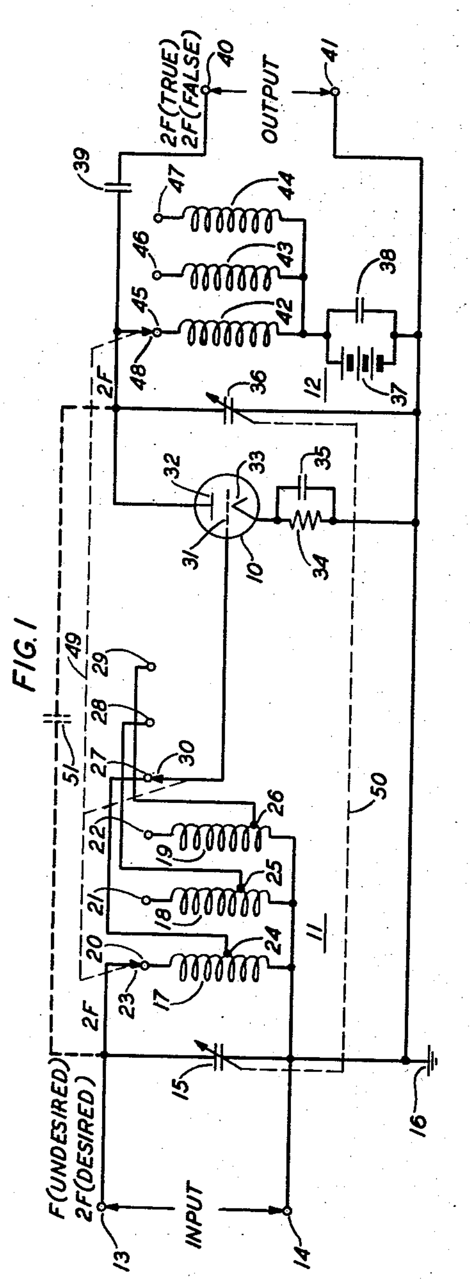

The invention relates to wave translating systems and more particularly to distortion reducing and noise reducing circuits therefor.

In wave translating systems the problem has frequently arisen of receiving, measuring, or otherwise utilizing a desired wave of relatively low intensity in the presence of one or more undesired waves of relatively high intensity, particularly where distortion of waves in the translating device results in harmonics or other modulation products of the undesired wave at or close to the frequency of the desired wave and of intensity comparable thereto.

It is known in connection with translating and amplifying devices to reduce the intensity of the undesired waves relatively to the desired waves whereby a reduction of one decibel, for example, in the intensity of the undesired wave relatively to the desired wave results in an improvement of approximtaely two decibels or more in the signal-distortion ratio. It is also known to reduce the input level of all the impressed waves, desired and undesired alike, whereby, again for example, a reduction of one decibel results in an improvement of approximately one decibel in the signal-distortion ratio, which is over and above the improvement effected by means of whatever frequency selectivity may be employed.

Certain problems arise, however, in realizing the expected improvement in operation, because in the process of reducing the input level the signal-noise ratio in the translating device may be degraded. Also, regenerative feedback may be introduced or increased to a point where the amplitude-frequency response of the translating device is adversely affected or self-oscillations are produced. Further, the frequency selectivity of the input circuit may be reduced, thereby nullifying part or all of the improvement expected.

A high grade wave translating system is generally required to have a good signal to noise ratio, good frequency selectivity, i. e. it must reject spurious signals, and it is required to have a suitable and convenient value of input impedance at the frequency to which it is tuned and a flat amplitude-frequency characteristic over a relatively wide frequency range. There are classes of uses in which there are present no extremely strong interfering signals and for such applications broad-band amplification is sufficient and no tuning control is required. In other applications it is necessary to enable the desired signal to override the noise produced in a converter unit or other modulating device. As is well known, space discharge devices such as vacuum tubes operated as modulators have higher equivalent input noise resistance values than the same tubes operated as amplifiers.

A very severe requirement on a wave translating device because of modulation effects occurs in the measurement of weak harmonic components accompanying a strong fundamental signal. For example, if an analyzer is designed to test the output of an extremely linear amplifier and the measurement of an extremely low second harmonic, say 80 to 90 decibels down in power level with respect to the fundamental, is required, and if there is no frequency discrimination in the analyzer, then the very first stage in the analyzer can generate a false second harmonic which can mask the true harmonic at the input and invalidate the measurement. For this reason frequency selectivity is required. In the input network for the first amplifier stage the fundamental may be attenuated by means of frequency selectivity and the input level may be kept sufficiently low to minimize second harmonic generated in the first amplifier stage.

In general the equivalent noise in any given space discharge tube decreases as the transconductance increases and since usually not enough fundamental rejection can be achieved in one stage, tuning must be employed in the output circuit as well as the input circuit of the first stage. Stray capacitance between the input and output circuits causes susceptibility to self-oscillations or variations in the amplitude-frequency response. This effect can be reduced by either reducing the amplification, by lowering the transconductance of the tube or other translating device, which will result in a lower (worse) signal to distortion ratio in the amplifier, or by decreasing the excitation of the tube which will improve the signal to distortion ratio in the amplifier at the expense of amplification in the stage. When working with a ganged condenser as the tunable element in a wide-band system this becomes particularly important as the frequency decreases because the capacitive reactance increases as the frequency decreases, thus increasing the excitation of the tube.

A suitable criterion upon which a system of the type described may be evaluated as to its performance is the maximum difference in power level that the system will tolerate between the desired wave and the undesired wave or waves, without either overloading due to too high level of total input of all the impressed waves or intermingling the desired signal with excessive noise due to too low level input of the desired signal relatively to the noise level inherent in the system.

A further practical requirement where the system is to be usable throughout a relatively broad frequency range is that the same variable tuning reactor shall be used over the entire range even though the variable reactor is used with a plurality of fixed reactors of different values, each of the fixed reactors being individual to a particular frequency band which is a subdivision of the whole frequency range to be covered. Such a variable reactor may be a variable condenser, for example, or an adjustable core inductor or other suitable device. A device of this sort, in order to be capable of precise setting and accurate calibration, is necessarily complex and expensive, representing a relatively large proportion of the total cost of the system, e. g. a vernier-operated variable condenser. Fixed reactors, either coils or condensers, are relatively inexpensive. Accordingly, it is highly desirable in practice to use but one adjustable reactor together with as many fixed reactors as are necessary to cover the complete range of frequencies to be observed.

Due to the use of a single variable reactor, the impedance of the tuned circuit becomes increasingly large at one end or the other of the frequency range. The variable condenser has larger impedance the lower the frequency, while the variable inductor has larger impedance the higher the frequency. The higher the impedance of the reactor, in the parallel type of tuned circuit, the higher the voltage developed across the tuned circuit at resonance. The higher the voltage developed across the tuned circuit and impressed upon the control element of the translating device, the greater the level of distortion produced. To reduce the distortion, it is known to be necessary that the impressed voltage be reduced. This might be done by means of a potentiometer comprised of resistors but the use of resistors tends to raise the relative noise level.

In accordance with the present invention, the voltage is reduced by incorporating a voltage dividing feature into the fixed reactor portion of the tuned input circuit, thereby accomplishing the desired reduction in distortion without at the same time raising the noise level unduly, and retaining the full degree of frequency selectively in the tuned circuit. The regenerative feedback which may be present in the translating device is at the same time made less effective because of the voltage step-down in the input circuit.

In a system that has been built and tested incorporating the invention, a second harmonic wave at a power level 100 decibels below the power level of the accompanying fundamental wave was successfully measured, the fundamental power level being one milliwatt (in a 75 ohm impedance).

Once a satisfactory energy relationship is obtained between the wanted and unwanted waves without the wanted wave being allowed to be obscured by noise in the process, generally the wanted wave can then be amplified in known manner in as many amplifying stages as are required to develop an output wave that can be detected or otherwise utilized.

Theoretically the above analysis applies to any stage in an amplifier, i. e. to achieve the maximum discrimination all stages should be run with as low a signal level as possible until the undesired signal has been reduced to the noise level. Practically, however, at the first amplifier stage when the lowering of the signal input is carried to the limit, noise in the first stage rises to limit the possible signal reduction. A compromise is to reduce the input impedance only to the equivalent noise resistance of the first stage and take a three decibel loss in noise performance. This loss is more than offset by the improved signal-distortion ratio obtainable.

By way of further example, in a case where a second harmonic at a level of minus 80 decibels is to be measured in the presence of a fundamental at zero level, the total input is attenuated 10 decibels by voltage step-down in the input circuit and the second harmonic voltage is stepped up by frequency selectivity in the tuned input network about 20 decibels to minus 70 decibels level at the first amplifier tube grid while the fundamental level is reduced to minus 25 decibels at the first amplifier tube grid. The anode circuit of the first amplifier being tuned to the second harmonic, the second harmonic is amplified 10 decibels to the minus 60 decibel level at the second amplifier grid. At the same time the fundamental level of minus 25 decibels generates a second harmonic at a level of minus 70 decibels at the second grid which is 10 decibels lower than the second harmonic input signal. The fundamental level at the second grid is reduced to minus 50 decibels.

Figure 2:
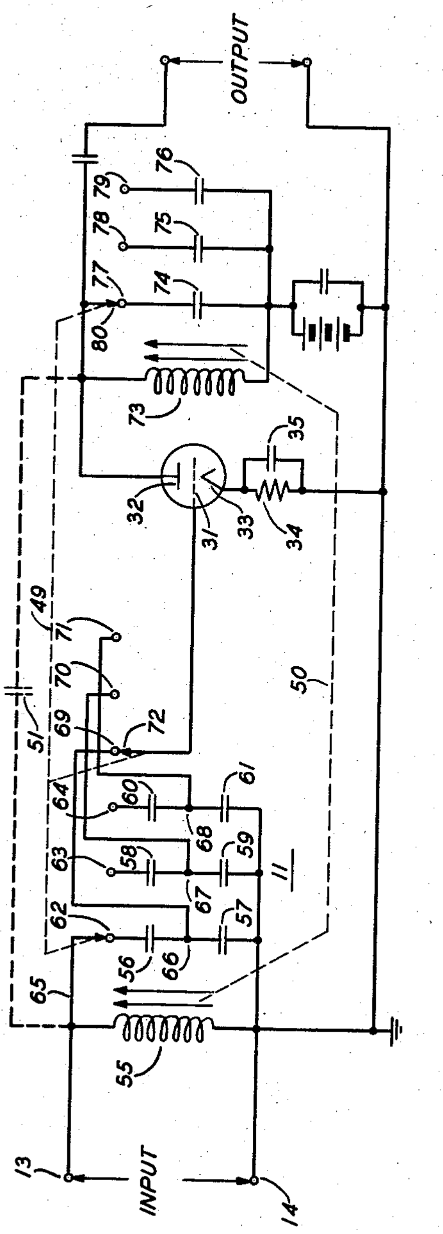

In the drawing:

Figs. 1 and 2 are schematic representations of two respective embodiments of the invention.

In Fig. 1, a wave translating device, exemplified by a space discharge amplifier 10, is shown provided with a frequency selective input circuit 11 and a frequency selective output circuit 12.

The input circuit 11 comprises input terminals 13 and 14 across which is connected a tuning condenser 15 that is variable. Terminal 14 together with one side of the input circuit may be grounded, as indicated at 16. A plurality of tuning inductors, of which three are shown by way of example at 17, 18 and 19, is each grounded at one end and is connected at the other end with fixed switch points 20, 21 and 22, respectively. A movable contactor 23 is fixedly connected to the terminal 13 and to the upper plate of the condenser 15 and is arranged to be selectively placed in contact with any one of the switch points 20, 21 or 22, as desired.

The inductors 17, 18, 19 are shown as tuning coils, each provided with a tapped connection, 24, 25, 26, respectively, intermediate between the ends of the coil. The tapped connections are in turn connected to fixed switch points 27, 28, 29, respectively, to which may be selectively connected a movable contactor 30, the latter contactor being fixedly connected to the control grid 31 of the space discharge device 10.

The control grid 31 controls the current between the anode 32 and cathode 33 of the device 10 in the well known manner, the control grid circuit being completed to ground by way of the cathode 33, a cathode resistor 34, and a by-pass condenser 35 in parallel with the cathode resistor.

The frequency selective output circuit 12 comprises a variable tuning condenser 36 with one side connected to the anode 32 and the other side connected to the low potential terminal of a space current supply source 37 shown as a battery. The low potential terminal of the source 37 is grounded and the source is shunted by a by-pass condenser 38 in accordance with the well known practice.

The anode 32 is connected through a direct-current blocking condenser 39 to an output terminal 40. The remaining output terminal 41 is grounded.

A plurality of tuning coils is provided for the output circuit, three being shown for example at 42, 43 and 44, each having one side connected to the high potential terminal of the source 37 and being connected at the other end with fixed switch points 45, 46 and 47, respectively. A movable contactor 48 is fixedly connected to the anode 32 and the upper terminal of the condenser 36 and is arranged to be placed selectively in contact with any one of the switch points 45, 46, 47.

The movable contactors 23, 30 and 48 are preferably mechanically linked together for simultaneous movement, as by means of a single handle (not shown). Such a linkage is represented schematically in the drawing by the system of broken lines 49. The linkage is such as to select for simultaneous use input and output tuning coils designed to cover the same tuning band, each combination covering a different band in the known manner.

The tuning condensers 15 and 36 are also preferably mechanically linked together (ganged) for simultaneous variation, the linkage being represented schematically by the broken line 50.

Any inherent parasitic capacitance between the respective stator elements of the condensers or elsewhere, which introduces a regenerative feedback from the output circuit to the input circuit of the translating device 10, is shown schematically as a condenser 51.

In the operation of the systems of Fig. 1, it will be assumed that an impressed complex wave at the input terminals 13, 14 comprises an undesired fundamental wave of frequency F, which may be of high intensity, and a desired wave of frequency 2F, which may be of relatively very low intensity. The linkage 49 is set to select an input tuning coil, for example coil 17, and an output tuning coil, for example coil 42, both of which coils are of suitable inductance value to advantageously tune to the frequency 2F in conjunction with the variable tuning condensers 15 and 36 respectively. Tuning to the frequency 2F is then accomplished in known manner by operating the linkage 50.

With the circuit so adjusted, the voltage level of the wave of frequency F is reduced relatively to the wave of frequency 2F due to the frequency selectivity of the input tuned circuit 11. The intensity of the wave of frequency F may still be as large or larger than that of the wave of frequency 2F. In order to reduce distortion of the complex wave in the translating device 10, it is advantageous to reduce the voltage levels of both the F component and the 2F component as these waves are impressed upon the control electrode of the translating device. This reduction is accomplished in accordance with the present invention by virtue of the voltage step-down effect obtained by connecting the input terminals 31, 33 of the translating device across a portion only of the input tuning coil, i. e. between the tapped connection 24 and the grounded end of the coil 17 as shown, the tapped coil constituting a voltage dividing reactance network. By this step-down arrangement, full advantage is taken of the frequency discriminating property of the tuned circuit 15, 17, and the voltage impressed upon the control element 31 is reduced to a fraction of the total voltage existing across the coil 17. At the same time, the noise level of the input circuit is not raised by introduction of any resistors as would be the case if an attenuator in the form of a resistance network had been used to accomplish the voltage step-down effect. While there is a slight increase in the noise level produced by stepping down the impedance facing the translating device, this increase is tolerable because it is accompanied by a decrease in the modulation and hence the distortion in the translating device. Modulation in this device with the input component waves assumed as illustrative produces a second harmonic of the fundamental wave of frequency F which harmonic wave, of course, is of the same frequency as the desired wave of frequency 2F and may be of comparable amplitude unless suitable steps are taken to reduce the effect of the modulation. Thus there are present in the output tuned circuit 12 two inseparable waves of the same frequency 2F, one constituting a true indication related to the desired input wave and the other constituting a false indication produced by and related to the undesired input wave of frequency F.

The true indication is strengthened relatively to the false indication, first by utilizing the frequency discrimination in the input circuit 11 to reduce the relative intensity of the undesired wave developed in the input circuit, and second, by reducing the intensity of both the waves at the control electrode 31.

The tap connections are preferably so placed that the impedance looking into the input tuned circuit from the control electrode circuit of the translating device is approximately the same whichever tuning coil is selected, and the value of this impedance is approximately equal to the equivalent noise resistance of the translating device. In case, for one or more of the tuning coils the equivalent noise resistance of the translating device equals or exceeds the total impedance of the tuned circuit, then no tap is to be provided for that coil.

Once the true indication has been given a sufficiently high intensity relatively to that of the false indication, the absolute magnitude of the true indication generally may be increased by amplification until it can be used to operate any suitable detector, provided the true indication does not become masked by the noise inherent in the translating device 10 or in the input and output circuits thereof.

In accordance with known theory of noise levels, the translating device 10 may be assigned a value of an equivalent noise resistance expressible in ohms. In a translating device which has been used in practicing this invention, a vacuum tube known as type 6J7, the equivalent noise resistance is 7000 ohms. At the lowest frequency used, the maximum impedance across the entire input tuned circuit was found to be 480,000 ohms. The tapped connection 24 was so placed that the impedance between the tap point 24 and ground was 7000 ohms. A degradation of the signal to noise ratio of approximately 2 to 1, or 3 decibels, was observed with the tapped coil compared with the ratio obtainable if the coil 17 were used untapped. This value of 3 decibels corresponds to the impedance ratio between the series combination of 7000 ohms and 480,000 ohms compared to 480,000 ohms on the one hand, and 7000 ohms in series with 7000 ohms compared to 7000 ohms on the other hand. It will be evident that as the input impedance of 480,000 ohms is transformed down to equal the 7000 ohm equivalent noise resistance of the tube, the signal to noise voltage ratio at the control grid is degraded approximately 2 to 1, or 3 decibels.

An incidental advantage in the circuit used, when both the input circuit and the output circuit are tuned, appears in connection with the regenerative feedback represented by the capacitance 51. The voltage fed back through the capacitance 51 is stepped down by the tapped connection of the coil 17 before the fed-back voltage is applied to the control electrode 31. In this way the stability of the system against self-oscillations is increased. Output tuning is often desirable in addition to input tuning, as it will generally be necessary to discriminate against undesired wave of frequencies close to that of the desired wave, which are unavoidably present in the input circuit and are repeated in the output circuit by amplifying action.

In Fig. 2 there is shown a second embodiment of the invention, in which an inductor 55 is provided with an adjustable core or tuning slug. The fixed coils of Fig. 1 are replaced by pairs of voltage dividing condensers 56, 57; 58, 59; and 60, 61. Each condenser pair comprises series connected condensers of suitable capacitance values to cover the desired tuning range in conjunction with the adjustable core inductor 55 and the relative capacitances of the condensers of each pair are selected to secure the desired voltage ratio.

The terminals of the condensers 56, 58 and 60 furthest from ground are connected respectively to fixed switch points 62, 63 and 64. A movable contactor 65 serves a purpose similar to that of contactor 23 of Fig. 1, connecting the ungrounded terminal of the adjustable core inductor 55 to any selected one of the switch points 62, 63, 64. The internal junction points 66, 67, 68 of the respective condenser pairs are connected to fixed switch points 69, 70, 71, respectively, to which may be selectively connected a movable contactor 72 corresponding in function to the contactor 30 of Fig. 1. The adjustable tuning element in the output circuit will generally be of the same kind as is used in the input circuit for satisfactory ganging. Accordingly an adjustable core inductor 73 is shown in Fig. 2 in place of the variable condenser 36 of Fig. 1. The inductors 55 and 73 are ganged in well known manner as indicated by the dotted line 50. The fixed coils 42, 43, 44 are replaced by fixed condensers 74, 75, 76, connected at their upper terminals to switch contactors 77, 78, 79 respectively. A movable contactor 80 serves the same purpose as that of contactor 48 in Fig. 1. The movable contactors 65, 72 and 80 are linked together as shown schematically by the broken line 49. The parasitic capacitance represented by the condenser 51 is indicated between the output circuit and the input circuit similarly to Fig. 1.

The operation of the system of Fig. 2, being substantially the same as that of the system of Fig. 1, will be evident to those versed in the art and need not be described in further detail.

An example of another wave translating device with which the invention may be used is the transistor, in which the emitter corresponds to the control grid and the collector corresponds to the anode in a space discharge device.

It is to be understood that the above-described arrangements are illustrative of the application of the principles of the invention. Numerous other arrangements may be devised by those skilled in the art without departing from the spirit and scope of the invention.

What is claimed is:

1. In a frequency selective amplifying system operative over a relatively wide frequency range that is divided into a plurality of frequency bands, said system discriminating between a desired wave and interfering waves of relatively high intensity which give rise to harmonics or other modulation products that are of substantially the same frequency as the desired wave and of comparable intensity; a wave translating device having input and output circuits and having a given value of equivalent noise resistance, an input tuning arrangement for the translating device of impedance high compared to said noise resistance, said tuning arrangement comprising a variable reactance portion common to all of said frequency bands and a plurality of fixed reactance portions each individual to a different one of said frequency bands and adapted to tune over said band in conjunction with said variable portion, and each said fixed reactance portion including a voltage dividing reactance network having a pair of output terminals across a portion of the network of impedance substantially equal to the said noise resistance of the translating device; and means for selectively connecting the output terminals of any one of said voltage dividing networks to the input circuit of the translating device, whereby modulation products in the output circuit of the translating device are minimized while permitting tuning over all said frequency bands with a single variable tuning device and while avoiding material increase in the relative noise level in the translating device.

2. The system according to claim 1 in which the variable reactance portion is a variable condenser and the fixed reactance portions are inductance coils.

3. The system according to claim 2 in which each inductance coil has an intermediate tap connection thereto and the output terminals of the said voltage dividing network comprise the said tap connection and one end of the coil.

4. The system according to claim 1, in which the variable reactance portion is an adjustable core inductor and the fixed reactance portions comprise condensers.

5. The system according to claim 4 in which the fixed reactances are pairs of condensers, the condensers of each pair being serially connected, and the output terminal of the said voltage dividing network comprise the junction of the two condensers and the remaining terminal of one of the condensers.

References Cited in the file of this patent

UNITED STATES PATENTS

| | | |
|---|---|---|
| 2,140,370 | Osborn et al. | Dec. 13, 1938 |
| 2,158,251 | Polydoroff | May 16, 1939 |
| 2,400,857 | Turner | May 21, 1946 |
| 2,437,910 | Crosby | Mar. 16, 1948 |
| 2,483,889 | De Groot | Oct. 4, 1949 |
| 2,668,198 | Bussard | Feb. 2, 1954 |